US010568223B2

(12) United States Patent
Foote

(10) Patent No.: US 10,568,223 B2
(45) Date of Patent: Feb. 18, 2020

(54) CABINET ELECTRIFICATION SYSTEM

(71) Applicant: Robert David Foote, Lake Stevens, WA (US)

(72) Inventor: Robert David Foote, Lake Stevens, WA (US)

( * ) Notice: Subject to any disclaimer, the term of this patent is extended or adjusted under 35 U.S.C. 154(b) by 0 days.

(21) Appl. No.: 16/399,926

(22) Filed: Apr. 30, 2019

(65) Prior Publication Data

US 2019/0289735 A1 Sep. 19, 2019

Related U.S. Application Data

(62) Division of application No. 15/921,572, filed on Mar. 14, 2018, now Pat. No. 10,292,288.

(51) Int. Cl.

| | |
|---|---|
| ***H05K 5/02*** | (2006.01) |
| ***H05K 5/03*** | (2006.01) |
| ***H05K 5/04*** | (2006.01) |
| ***H01R 25/16*** | (2006.01) |
| ***H01R 31/00*** | (2006.01) |
| ***A47B 47/00*** | (2006.01) |
| ***A47B 96/02*** | (2006.01) |
| ***H01R 25/00*** | (2006.01) |
| ***A47B 96/20*** | (2006.01) |

(Continued)

(52) U.S. Cl.

CPC ........... *H05K 5/0247* (2013.01); *A47B 47/00* (2013.01); *A47B 96/02* (2013.01); *A47B 96/021* (2013.01); *A47B 96/205* (2013.01); *H01R 25/006* (2013.01); *H01R 25/162* (2013.01); *H01R 31/00* (2013.01); *H05K 5/0226* (2013.01); *H05K 5/03* (2013.01); *H05K 5/04* (2013.01); *A47B 2220/0075* (2013.01); *A47B 2220/0077* (2013.01); *A47B 2220/0091* (2013.01); *H01R 13/6608* (2013.01); *H01R 25/147* (2013.01)

(58) Field of Classification Search

CPC ................................ H05K 5/0247; H05K 5/04

See application file for complete search history.

(56) References Cited

U.S. PATENT DOCUMENTS 3,918,224 A 11/1975 Sundequist
4,689,726 A 8/1987 Kretzschmar (Continued)

FOREIGN PATENT DOCUMENTS

WO 2016020907 A1 2/2016
WO 2016111628 A1 7/2016

OTHER PUBLICATIONS

Official Communication for U.S. Appl. No. 15/921,573 dated Mar. 7, 2019, pp. 1-8.

(Continued)

*Primary Examiner* — Hung V Ngo

(74) *Attorney, Agent, or Firm* — John W. Branch; Lowe Graham Jones PLLC

(57) ABSTRACT

One of more panels of the cabinet include at least one conductive region that is optionally covered by an insulative covering. These conductive regions are coupled to an external power source. Shelves, drawers, other cabinet components, electrical devices in a cabinet (including, but not limited to, a motor, lights, outlet, appliance, sensor, processor, etc.), and the like can further conduct or receive electrical energy by electrically coupling to the conductive regions within the panels of the cabinet, for example, through shelf pins that are inserted into holes in the panels.

7 Claims, 4 Drawing Sheets

330
334
336
332
450
338
108
340

(51) Int. Cl.
*H01R 13/66* (2006.01)
*H01R 25/14* (2006.01)

(56) References Cited

U.S. PATENT DOCUMENTS

| | | | |
|---|---|---|---|
| 4,973,796 A | 11/1990 | Dougherty et al. | |
| 5,425,648 A | 6/1995 | Farham | |
| 5,915,824 A | 6/1999 | Straat | |
| 6,042,244 A | 3/2000 | Witkoski | |
| 6,231,205 B1 | 5/2001 | Slesinger et al. | |
| 6,726,115 B1 | 4/2004 | Chiles | |
| 8,415,568 B1 | 4/2013 | Hansen et al. | |
| 2001/0036070 A1 | 11/2001 | Compagnucci | |
| 2002/0124512 A1* | 9/2002 | Dean ...................... | A63G 25/00 52/506.01 |
| 2004/0090156 A1 | 5/2004 | Kunanantakul | |
| 2008/0278932 A1 | 11/2008 | Tress | |
| 2010/0008072 A1 | 1/2010 | Meier-Graichen et al. | |
| 2011/0273867 A1 | 11/2011 | Horst et al. | |
| 2012/0011754 A1 | 1/2012 | Matyear | |
| 2014/0210279 A1 | 7/2014 | Van Herpen et al. | |
| 2015/0144578 A1 | 5/2015 | Maiden | |
| 2016/0104566 A1 | 4/2016 | O'Brien et al. | |
| 2017/0181541 A1 | 6/2017 | Stanley, Jr. et al. | |

OTHER PUBLICATIONS

Official Communication for U.S. Appl. No. 15/921,572 dated Nov. 2, 2018, pp. 1-13.

Official Communication for U.S. Appl. No. 16/399,904 dated Jun. 24, 2019, pp. 1-14.

Official Communication for U.S. Appl. No. 15/921,572 dated Jul. 27, 2018, pp. 1-8.

International Search Report and Written Opinion for International Patent Application No. PCT/US2019/032051 dated Nov. 27, 2019, pp. 1-16.

* cited by examiner

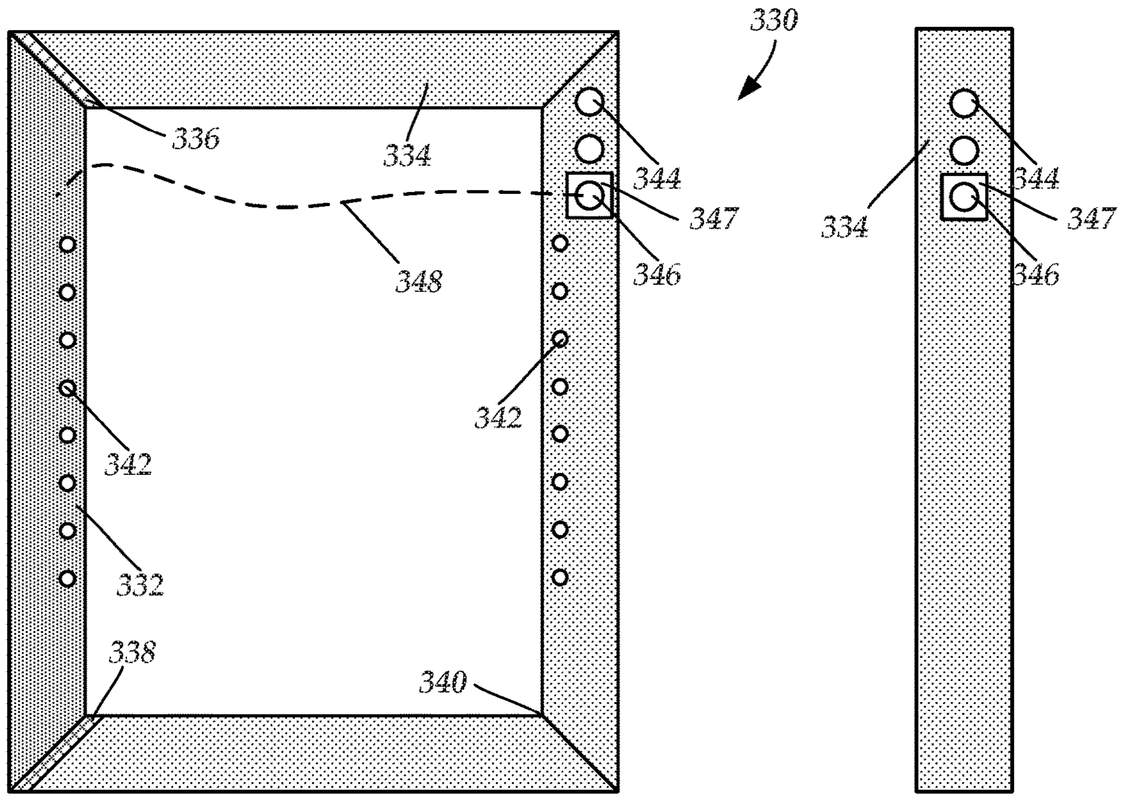
Fig. 3C
Fig. 3D
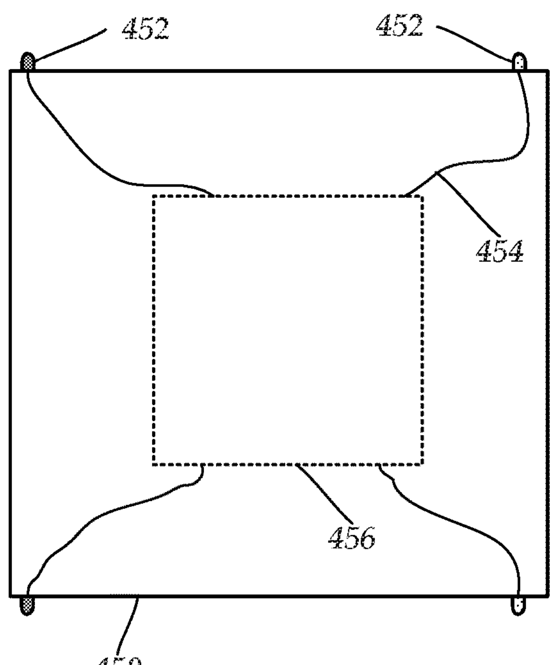
Fig. 4A
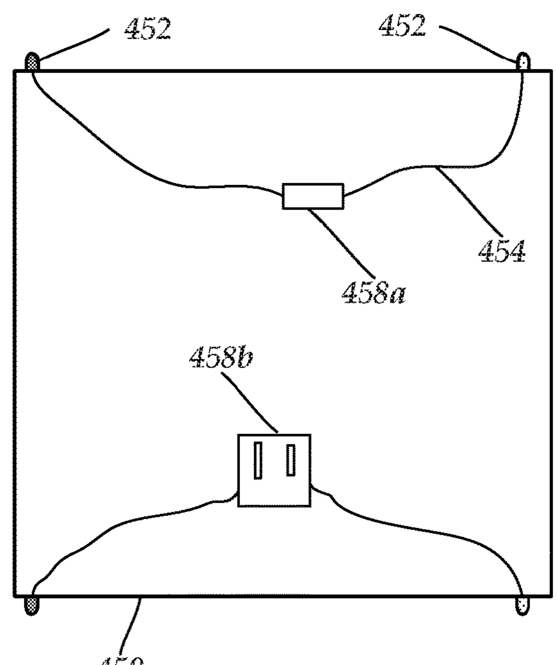
Fig. 4B

CABINET ELECTRIFICATION SYSTEM

CROSS-REFERENCE TO RELATED APPLICATION(S)

This Utility Patent Application is a Divisional of U.S. patent application Ser. No. 15/921,572 filed on Mar. 14, 2018, now U.S. Pat. No. 10,292,288 issued on May 14, 2019, the benefit of which is claimed under 35 U.S.C. § 121, and the contents of which is further incorporated in entirety by reference.

TECHNICAL FIELD

The invention is directed to a cabinet with panels that can be electrified. The invention is also directed to cabinets and electrical devices within the cabinets that can be operated using electrified panels of the cabinet.

BACKGROUND

Conventionally, electrical lighting or other electrical devices within cabinets are often provided power through wiring that enters the cabinet through holes in the cabinet. This wiring may be exposed or hidden beneath or behind a shelf or valence. Other conventional arrangements place exposed metal strips along the panels, often at the back, of the cabinet. The wiring and exposed metal strips can detract from the aesthetic of the cabinet interior, may present some hazard, or may be easily damaged.

BRIEF DESCRIPTION OF THE DRAWINGS

FIG. 3C is a side view of a third embodiment of a frame for a panel of a cabinet, the frame includes two conductive regions joined together by two non-conductive connectors, according to the invention;

FIG. 3D is a rear view of a fourth embodiment of a frame for a panel of a cabinet, the frame includes two conductive regions joined together by two non-conductive connectors, according to the invention;

FIG. 4A is a top view of one embodiment of a shelf of a cabinet, the frame with conductive pins and an electrical device attached to, or disposed within, the shelf, according to the invention;

FIG. 4B is a top view of another embodiment of a shelf of a cabinet, the frame with conductive pins and a port and an outlet attached to, or disposed within, the shelf, according to the invention;

DETAILED DESCRIPTION OF THE INVENTION

Various embodiments now will be described more fully hereinafter with reference to the accompanying drawings, which form a part hereof, and which show, by way of illustration, specific embodiments by which the invention may be practiced. The embodiments may, however, be embodied in many different forms and should not be construed as limited to the embodiments set forth herein; rather, these embodiments are provided so that this disclosure will be thorough and complete, and will fully convey the scope of the embodiments to those skilled in the art. Among other things, the various embodiments may be methods, articles, systems, devices, or any combination thereof. The following detailed description is, therefore, not to be taken in a limiting sense.

Briefly stated, various embodiments are directed to methods, articles of manufacture, and systems for electrification of cabinets. One of more panels of the cabinet include at least one conductive region that is optionally covered by an insulative covering. These conductive regions are coupled to an external power source. Shelves, drawers, other cabinet components, electrical devices in a cabinet (including, but not limited to, a motor, lights, outlet, appliance, sensor, processor, etc.), and the like can further conduct or receive electrical energy by electrically coupling to the conductive regions within the panels of the cabinet, for example, through shelf pins that are inserted into holes in the panels.

Figure 1:
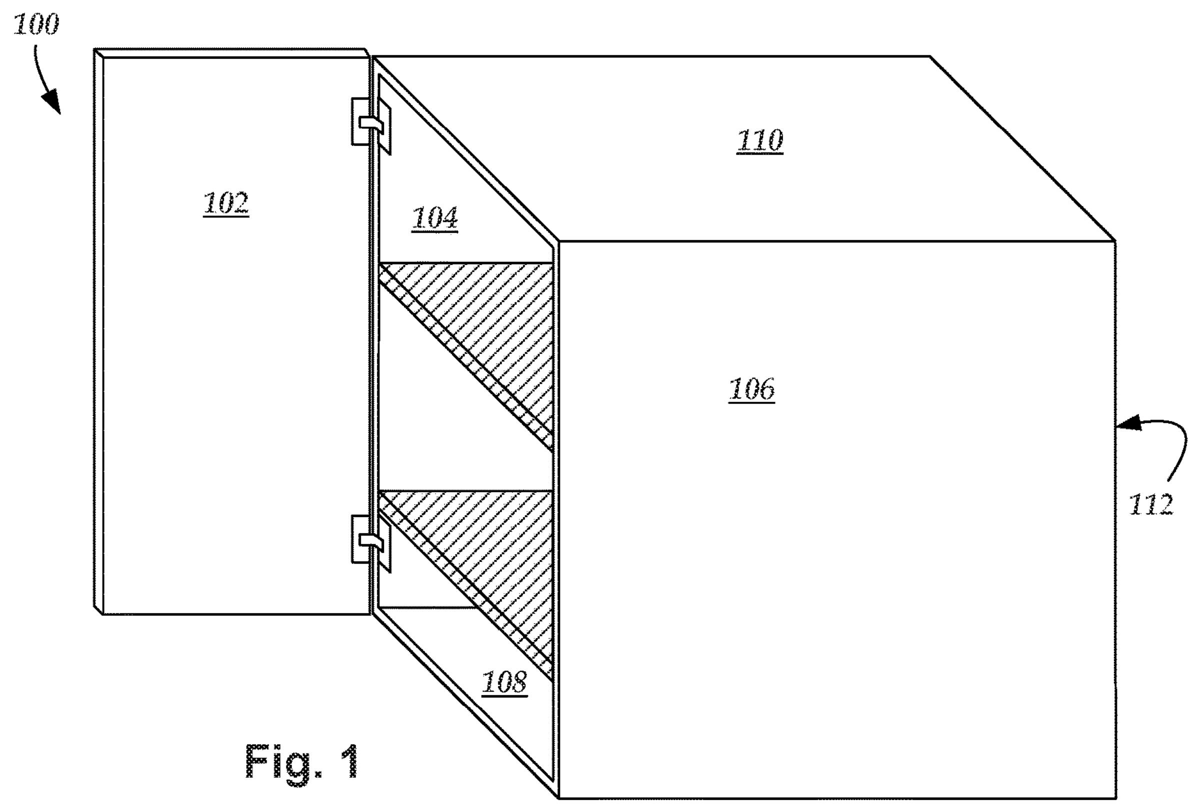
FIG. 1 is a perspective view of one embodiment of a cabinet with shelves, according to the invention.

FIG. 1 illustrates one embodiment of a cabinet 100 that includes a door 102, two side panels 104, 106, a bottom panel 108, a top panel 110, a back panel 112, and one or more shelves 114. The illustrated cabinet 100 is a standalone cabinet, but it will be understood that other cabinets can be part of a set of cabinets in any configuration and that cabinets in such a set may share side panels 104, 106, top panel 110, or bottom panel 108, or any combination thereof. In addition, it will be understood that other cabinets may not include all of the components of cabinet 100. For example, other cabinets may not include a door 102, a back panel 112, a top panel 110, or a bottom panel, or any combination thereof. It will also be understood that panels described herein can also be used for drawers, shelving, or other storage containers.

The side panels 104, 106, bottom panel 108, top panel 110, and back panel 112 are typically attached to each other using any suitable fastener or fastening arrangement including, but not limited to, the use of joints, nails, screws, adhesive, or the like.

Figure 2:
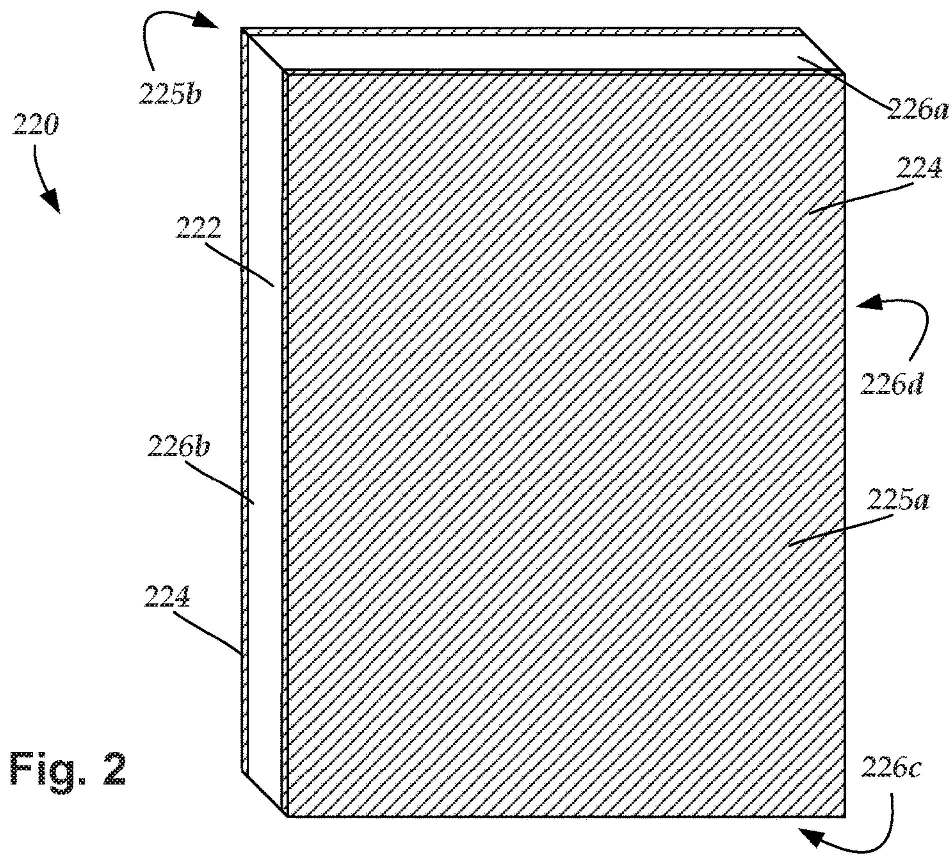
FIG. 2 is a perspective view of one embodiment of a panel of a cabinet with a core and a cover, according to the invention.

FIG. 2 illustrates one embodiment of a panel 220 that can be used for any of the side panels 104, 106, the bottom panel 108, the top panel 110, or the back panel 112. The panel includes a core 222 and a cover 224. In the illustrated embodiment, the cover 224 is disposed on only two major surfaces 225*a*, 225*b* of the core 222, but it will be understood that the cover 224 may also be disposed over one or more (or all) of the side surfaces 226*a*, 226*b*, 226*c*, 226*d* of the core. In some arrangements, the cover 224 may be provided over only one major surface, provided over less than the full extent of one or more major surfaces or side surfaces of the core, or may even be omitted altogether.

The core 222 can be a solid material that fills the entire middle region of the panel 220. Alternatively, the core 222 can be a frame (see, for example, FIGS. 3A-3C) that forms the side surfaces of the core 222 with has an open region in the center of the panel 220 and may optionally, have one or more struts or supports extending through that open region and between portions of the frame.

The cover 224 can be any suitable material including, but not limited to, wood, plastic, glass, laminate, wood composites, or the like. The cover 224 may be provided to protect the core, for aesthetic appearance, or any combination thereof or any other suitable reason.

The panels of a cabinet can be made of all the same type of construction or can differ in construction. For example, some panels of a cabinet may utilize a frame construction and some panels may utilize a solid core construction.

Figure 3A:
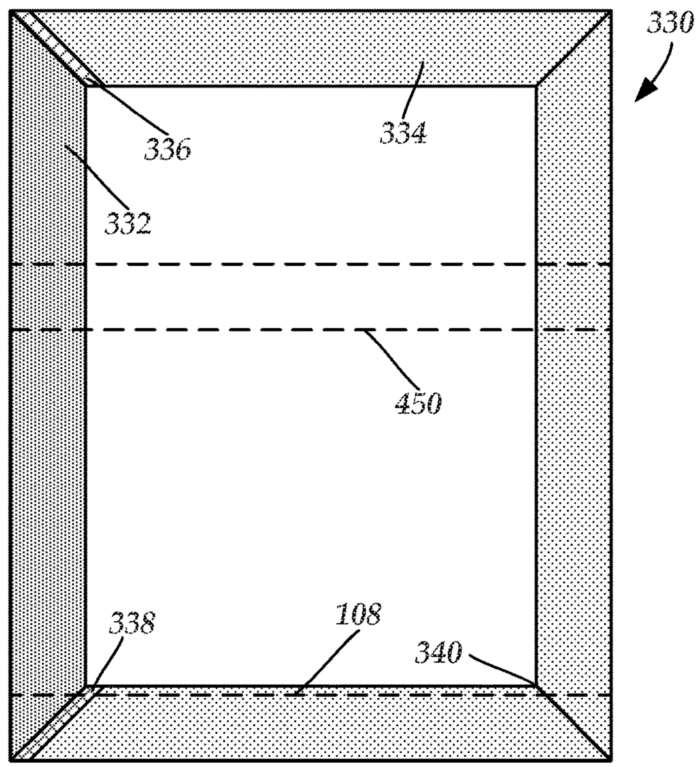
FIG. 3A is a side view of one embodiment of a frame for a panel of a cabinet, the frame includes two conductive regions joined together by two non-conductive connectors, according to the invention.
Figure 3B:
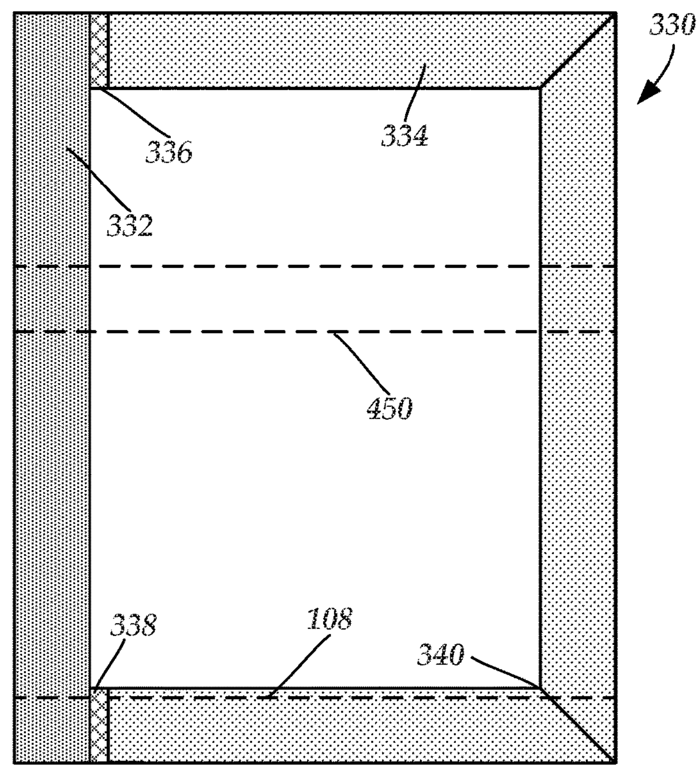
FIG. 3B is a side view of another embodiment of a frame for a panel of a cabinet, the frame includes two conductive regions joined together by two non-conductive connectors, according to the invention.

Cabinet electrification can be achieved by electrifying the core of one or more panels of the cabinet. FIGS. 3A and 3B illustrate two embodiments of a frame 330 for use in the core of a panel. The frame 330 has at least two conductive regions 332, 334 that are separated by non-conductive (e.g., insulative) connectors 336, 338. The two conductive regions 332, 334 may be made of any suitable conductive material including, but not limited to, aluminum, steel, stainless steel, or any other suitable metal or alloy. Aluminum may be particularly suitable due to, for example, its light weight and resistance to destructive oxidation. In at least some embodiments, the frame 330 may be made of solid metal pieces, hollow metal tubing, or any combination thereof or any other shaped, cast, molded, or other arrangement of conductive elements. As an example, the frame 330 may be made of hollow aluminum tubing.

The non-conductive connectors 336, 338 can be made of any suitable non-conductive material including, but not limited to, plastic (for example, thermoplastics or thermoset polymers), glass, ceramics, or the like, or any combination thereof. In some embodiments, the frame 330 may also include one or more conductive connectors 340 which can be made of any suitable conductive material including, but not limited to, metals and alloys.

In the illustrated embodiments of FIGS. 3A and 3B, one conductive region 332 corresponds to one side of the frame 330 and defines one edge of the frame and the other conductive region 334 corresponds to the other three sides of the frame 330 and defines three edges of the frame. It will be understood that other arrangements of the two conductive regions 332, 334 (for example, each conductive region along two sides of the frame and defining two edges of the frame) can be used. Moreover, other embodiments may include more than two conductive regions with each conductive region separated from the other conductive regions by non-conductive connectors. As indicated above, a cover can be placed over one or more (or all) of the surfaces of the frame 330, as illustrated in FIG. 2.

In at least some embodiments, in operation, one conductive region (for example, region 332) is positively charged (or has a positive voltage applied) and the other conductive region (for example, region 334) is grounded. Such an arrangement will be used as an example herein, but other electrification arrangements can be used and it will be understood that any of the examples described herein can be adapted to use any of the other electrification arrangements. For example, one conductive region may be negatively charged (or has a negative voltage applied) and the other conductive region may be grounded. As another example, one conductive region may be positively charged (or has a positive voltage applied) and the other conductive region may be negatively charged (or has a negative voltage applied).

As an example, conductive region 332, which is at the front of the frame 330, is positively charged (or has a positive voltage applied) and the other conductive region 334 is grounded. In at least some embodiments, it is preferable that every electrified frame in a cabinet or in a set of cabinets has the same arrangement, for example, with the front of the frame positively charge and the other parts of the frame grounded. This provides consistency between the panels or cabinets and may also prevent or reduce the likelihood of shorts when panels or cabinets are attached to each other.

The frames 330 can be used for side panels (see, for example, side panels 104, 106 of FIG. 1). The dotted lines in FIGS. 3A and 3B indicate possible positions of one or more shelves or a bottom panel (see, for example, bottom panel 108 of FIG. 1). The shelf or bottom panel can make contact with the two conductive regions 332, 334 to electrify the shelf to provide electrical power to an electrical device or outlet that is provide on or within the shelf. Alternatively or additionally, an electrical device or outlet could be attached directly to two conductive regions 332, 334 of the frame 330 in order to provide electrical power to that device or outlet.

FIG. 3C illustrates another embodiment of a frame 330 with two conductive regions 332, 334 and two non-conductive regions 336, 338. The frame also includes holes 342 extending into the frame for receiving pins of a shelf. FIGS. 4A and 4B illustrate two embodiments of a shelf 450 with pins 452 that can fit in the holes 342 in the frame 330. The pins 452 are conductive and, therefore, make electrical contact with the frame 330 when the shelf is positioned in the cabinet with the pins 452 in the holes 342.

Also, the frame 330 can have one or more contacts 344, 346 for attachment to a power source, such as wires or a powered cabinet hanger or any other suitable arrangement. In the illustrated embodiment, one or more contacts 344 are arranged for attachment to a ground and one or more contacts 346 are insulated from the conductive region 334 and arranged for attachment to a positively charged power source. For example, the structure 346 can include a conductive element 345 surrounded by a non-conductive insulator 347 (for example, a plastic piece) that fits into an opening in the conductive region 334. An insulated wire 348 can extend from the conductive element to the conductive region 332 where it is attached to provide power to the conductive region 332. As an example, the frame 330 may be made of hollow aluminum tubing and the wire 348 can pass through a hole in the aluminum tubing of conductive region 334, through the open center region of the frame and attached to the exterior of the conductive region 332 or pass through a hole in the aluminum frame of conductive region 332 for attachment to the interior of the frame.

In FIG. 3C, the contacts 344, 346 are placed on the face of the frame 330. As an alternative, the structures 344, 346 can be positioned on a side of the frame 330, as illustrated in FIG. 3D to facilitate attachment to wires or a cabinet hanger that is positioned behind the back of the cabinet. For example, wires from the wall can be attached to the contacts 344, 346 during cabinet installation to electrify the cabinet.

Figure 5A:
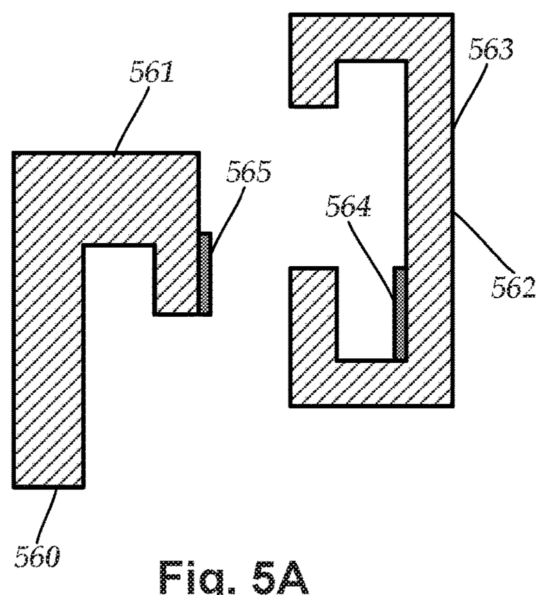
FIG. 5A is a cross-sectional view of one embodiment of a hanger for a cabinet and a corresponding wall mount for use with the cabinets, panels, and frames of FIGS. 1-3D, according to the invention.

FIG. 5A illustrates another arrangement in which a cabinet hanger 560 is attached to the cabinet and a mount 562 is attached to the wall or other surface. A portion 563 of the mount 562 is grounded and then grounds the portion 561 of the cabinet hanger 560. An insulated strip 564 on the mount 562 is positively charged from a power source and makes physical and electrical contact with a corresponding insulated strip 565 on the cabinet hanger 560. The insulated strip 565 is in turn attached to a wire (such as wire 348 of FIG. 3C) that is attached to the conductive region 332 (FIG. 3C).

Figure 5B:
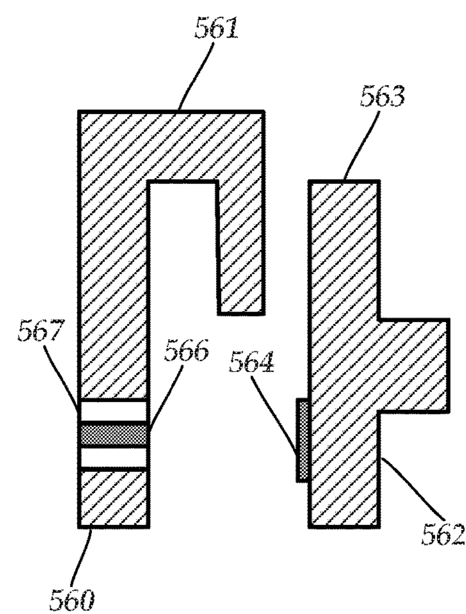
FIG. 5B is a cross-sectional view of another embodiment of a hanger for a cabinet and a corresponding wall mount for use with the cabinets, panels, and frames of FIGS. 1-3D, according to the invention.

An alternative arrangement of a cabinet hanger 560 and mount 562 is illustrated in FIG. 5B. The portion 563 of the mount is grounded and will then ground the portion 561 of the cabinet hanger 560. The insulated strip 564 on the mount is positively charged and makes physical and electrical contact with a conductive element 566 that is surrounded by an insulator 567 and attached to a wire (such as wire 348 of FIG. 3C) to electrify the conductive region 332 (FIG. 3C).

The mounts 562 of FIGS. 5A and 5B can be securely mounted to wall studs or other supports and provide a mechanism for electrifying a cabinet without attaching wires to the cabinet during cabinet installation. In at least some embodiments, the mounts 562 of FIGS. 5A and 5B can be a rail that extends along the wall and allows attachment, and electrification, of multiple cabinets using the same rail mount system. A cap or other device may be inserted into or over unused or exposed portions of the rail to insulate the strip 564 from inadvertent contact or shorting.

Returning to FIGS. 4A and 4B, the shelf 450 has conductive pins 452, as described above, that are arranged to make contact with the conductive regions 332, 334 of the frame 330 (FIGS. 3A-3C). In at least some embodiments, wires 454 or conductors within or beneath or otherwise arranged around the shelf 450 can extend from the pins to a device 456 or outlet 458*a*, 458*b* to provide power to the device or outlet. In some embodiments, the device or outlet may be directly connected to a pin without using a wire or other conductor.

As an alternative, if the shelf is permanent or, for example, the bottom or top panel of the cabinet, fasteners, such as screws, nails, or bolts, can be used to fasten the shelf or panel to the frame 330 with the fastener making the physical and electrical contact between the conductive region on the frame and the wires, device, or outlet associated with the shelf or panel. The following are a few examples of uses and devices that can be energized using the electrified cabinet. A shelf 450 may include one or more built-in lights (within, on, under, or otherwise arranged around the shelf) as the device 456 and the lights may be arranged to turn on when the cabinet door is opened and turn off when the cabinet door is closed (or may utilize a switch inside or outside of the cabinet to operate the lights). One or more "kick" lights can be integrated into a bottom shelf or bottom panel of a cabinet. The shelf 450 or cabinet can include built-in speakers that are powered through the conductive regions 332, 334, of the frame 330. The shelf 450 or cabinet can include a projector to, for example, project recipes onto a countertop surface or a camera to, for example, act as a security camera. The projector or camera can be powered through the conductive regions 332, 334, of the frame 330.

A USB or other charging port 458*a* or any other type of port or a conventional female outlet 458*b* or any other type of outlet can be built into the shelf 450. Alternatively, the powered device 456 can be an inductive charging device within or beneath the shelf for charging a mobile phone or other device.

A sensor to sense moisture or temperature may be integrated into a shelf or cabinet and powered through the conductive regions 332, 334, of the frame 330. This may be useful to, for example, warn of high temperatures near a stove or oven or excessive moisture near a sink. A weight or pressure sensor may be integrated into a shelf or cabinet and powered through the conductive regions 332, 334, of the frame 330. This may be useful to, for example, alert a user to empty a trashcan or to refill a pantry or to track recycling.

A motor for opening a door or drawer or extending a shelf or lowering a television or other device from an upper cabinet can be integrated into the cabinet or shelf and powered through the conductive regions 332, 334, of the frame 330. For example, a motor may be used to extend a shelf with a trashcan or with pantry goods upon request. Request may be made using a sensor (such as a motion sensor or voice-activated sensor) are may be made through home automation devices.

An alarm or lock can be integrated into the cabinet and powered through the conductive regions 332, 334, of the frame 330 to, for example, send a warning or prevent access to cleaning supplies, other hazardous materials, medicines, liquor, or valuables stored in the cabinet. In some embodiments, these devices may include, or be coupled to a wireless transmitter, to send warnings to, or respond to commands from, a mobile phone, smart watch, or other device.

Figure 6:
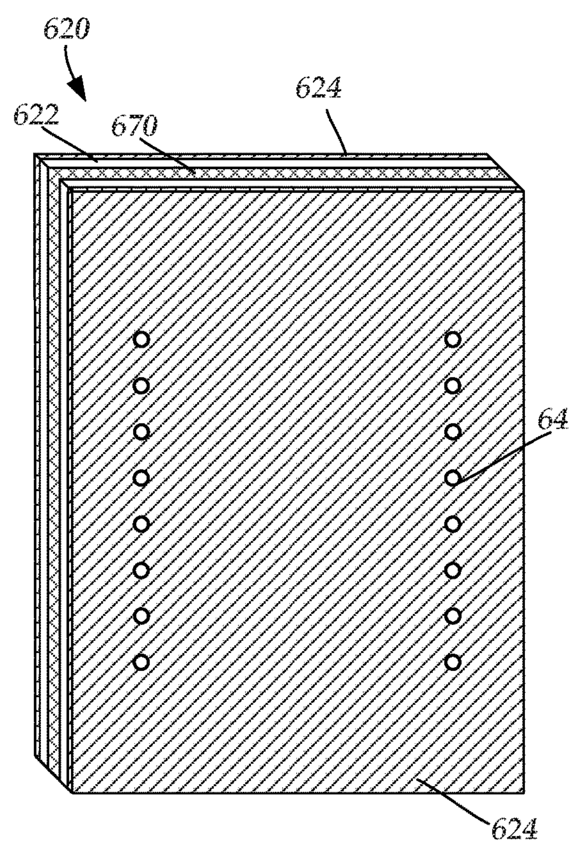
FIG. 6 is a perspective view of another embodiment of a panel of a cabinet with a core having a conductive layer, according to the invention.

Alternative embodiments also utilize a conductive core. For example, the side panels 104, 106 of cabinet 100 in FIG. 1 have the panel structure illustrated in FIG. 6 with the core 622 having a conductive layer 670 (which may be the entire core 622 or one of multiple layers in the core) so that the core is capable of conducting electricity across the entirely of the core or panel (e.g., across the length and breadth of the core or panel.) In one embodiment, in operation, one of the side panels 104, 106 has a core that is positively charged and the other one of the side panels has a core that is grounded. It will be understood that other combinations of the side panels, top panel, bottom panel, and back panel can be used.

Similar to the arrangement described above with respect to the frame of FIG. 3C and the shelves of FIGS. 4A and 4B, holes 642 can be made through the cover 624 to the conductive layer 670 of the core 622 to receive pins 452 of a shelf 450 to electrify the shelf. As an alternative, if the shelf is permanent or, for example, the bottom or top panel of the cabinet, fasteners, such as screws, nails, or bolts, can be used to fasten the shelf or panel to the panels 104, 106 with the fastener making the physical and electrical contact between the respective conductive layer of the core of the panels and the wires, device, or outlet associated with the shelf or panel.

Figure 7:
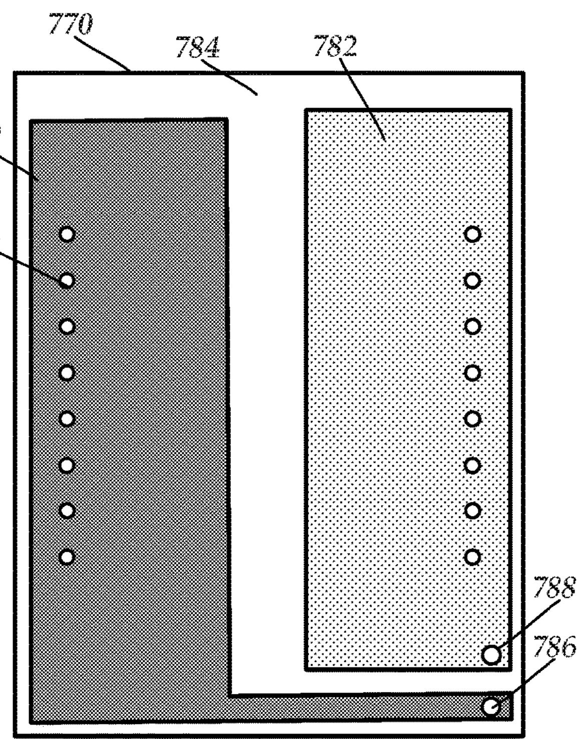
FIG. 7 is side view of one embodiment of a layer of a core with multiple conductive regions, according to the invention.

FIG. 7 illustrates yet another alternative arrangement in which a core (such as core 222 in FIG. 2) or a cover (such as cover 224 in FIG. 2) includes a layer 770 having multiple conductive regions 780, 782 disposed on a insulative substrate 784 or other insulating layer. The conductive regions 780, 782 may be made of, for example, conductive plates, foil, deposited layers, or the like. The conductive regions 780, 782 can be made using any suitable manufacturing method including, but not limited to, lamination and methods used for making circuit boards.

As an example, one of the conductive regions 780 can be positively charged and the other conductive region 782 can be grounded. Similar to the arrangement described above with respect to the frame of FIG. 3C and the shelves of FIGS. 4A and 4B, holes 742 can be made through the cover to the layer 770 of the core to access the conductive regions 780, 782. The holes 742 can receive pins 452 of a shelf 450 to make physical and electrical contact between the pins 452 and the conductive regions 780, 782 to electrify the shelf. As an alternative, if the shelf is permanent or, for example, the bottom or top panel of the cabinet, fasteners, such as screws, nails, or bolts, can be used to fasten the shelf or panel to the core with the fastener making the physical and electrical contact between the conductive regions 780, 782 of the layer 770 of the core and the wires, device, or outlet associated with the shelf or panel.

Wires or contacts from a power source can be coupled to the conductive regions 780, 782 at sites 786, 788 (which may be contacts or holes through the cover) to energize the arrangement. It will be recognized that other mechanisms for energizing the conductive regions 780, 782 of the core can also be used.

As presented herein, a shelf of a cabinet has been used as one example of a structure that can be electrified, but other structures can also be electrified. For example, a cabinet may have drawers and the drawer or a bottom panel or side panel of the drawer (or any other component of the cabinet) may be electrified using the arrangements described above. For example, a drawer glide mechanism may be electrified so that touching the drawer would actuate a motor in the drawer glide mechanism to open or close the drawer automatically. As another example, a door opening or lifting arrangement can be electrified using the arrangements described herein. It will be understood that all of the examples presented herein for use with a shelf can also be applied to a drawer or other component of the cabinet.

The above specification, examples, and data provide a complete description of the manufacture and use of the invention. Since many embodiments of the invention can be made without departing from the spirit and scope of the invention, the invention resides in the claims hereinafter appended.

What is claimed as new and desired to be protected by Letters Patent of the United States is:

1. A cabinet, comprising:

a plurality of panels, each panel forming one of a side, top, bottom, or back of the cabinet, one or more of the panels comprising:

a core and a cover disposed over at least one surface of the core, wherein the core comprises an insulative substrate, a first conductive region disposed on the insulative substrate, and a second conductive region disposed on the insulative substrate; and a shelf and an electrical outlet or port attached to, or disposed within, the shelf wherein the shelf is configured to engage the first conductive region and the second conductive region of one of the panels to provide electrical power to the electrical outlet or port when the first and seco d conductive regions of the one of the panels are electrically coupled to an electrical power source.

2. The cabinet of claim 1, wherein the one or more of the panels further comprises one or more first holes through the cover to the first conductive region and one or more second holes through the cover to the second conductive region.

3. The cabinet of claim 1, wherein the one or more of the panels further comprises one or more first holes through the cover to the first conductive region and one or more second holes through the cover to the second conductive region, the cabinet further comprising a shelf, the shelf comprising a first conductive pin configured for insertion in one of the first holes and a second conductive pin configured for insertion in one of the second holes.

4. The cabinet of claim 1, further comprising an electrical device attached to, or disposed within, the shelf, wherein the shelf is configured to engage the first conductive region and the second conductive region of one of the panels to provide electrical power to the electrical device when the first and second conductive regions of the one of the panels are electrically coupled to an electrical power source.

5. The cabinet of claim 1, wherein each of the one or more of the panels further comprises a first contact and a second contact, wherein the first contact is in electrical communication with the first conductive region and the second contact is in electrical communication with the second conductive region, wherein the first and second contacts are configured and arranged for attachment of conductors from an external electrical power source.

6. The cabinet of claim 1, wherein the one or more of the panels comprises a side panel, wherein the panels further comprise a bottom panel and the cabinet further comprises an electrical device attached to, or disposed within, the bottom panel, wherein the bottom panel is configured to engage the first conductive region and the second conductive region of the side panel to provide electrical power to the electrical device when the first and second conductive regions of the side panel are electrically coupled to an electrical power source.

7. The cabinet of claim 1, wherein the one or more of the panels further comprises a cover disposed over all surfaces of the core.

* * * * *